(12) United States Patent
Yagi et al.

(10) Patent No.: US 8,450,128 B2
(45) Date of Patent: May 28, 2013

(54) METHOD FOR PRODUCING SEMICONDUCTOR OPTICAL DEVICE AND SEMICONDUCTOR OPTICAL DEVICE

(75) Inventors: Hideki Yagi, Yokohama (JP); Hiroyuki Yoshinaga, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 60 days.

(21) Appl. No.: 13/267,952

(22) Filed: Oct. 7, 2011

(65) Prior Publication Data
US 2012/0094415 A1    Apr. 19, 2012

(30) Foreign Application Priority Data
Oct. 19, 2010    (JP) .................. 2010-234754

(51) Int. Cl.
*H01L 21/00*    (2006.01)
(52) U.S. Cl.
USPC ........... 438/33; 438/39; 438/46; 257/E33.059
(58) Field of Classification Search
USPC .................. 438/33, 39, 46; 257/E33.059
See application file for complete search history.

(56) References Cited

U.S. PATENT DOCUMENTS

| 8,124,543 B2 * | 2/2012 | Yagi et al. ............ 438/737 |
| 8,218,591 B2 * | 7/2012 | Onishi et al. ............ 372/34 |
| 2008/0197377 A1 * | 8/2008 | Sudo et al. ............ 257/99 |

FOREIGN PATENT DOCUMENTS
JP    2008-205025    9/2008

* cited by examiner

*Primary Examiner* — Trung Q Dang
(74) *Attorney, Agent, or Firm* — Smith, Gambrell & Russell, LLP

(57) ABSTRACT

A method for producing a semiconductor optical device includes the steps of forming a semiconductor region including a ridge structure on a substrate; forming an insulating film on the semiconductor region; forming a non-photosensitive resin region on the insulating film, forming a first mask that defines a scribe area; forming the scribe area by etching using the first mask; after removing the first mask, forming an insulating layer by etching the insulating film, forming an electrode on the ridge structure and the non-photosensitive resin region to produce a substrate product; forming a scribe line on a surface of the semiconductor region in the scribe area of the substrate product; and cutting the product along the scribe line to form a semiconductor laser bar.

11 Claims, 7 Drawing Sheets

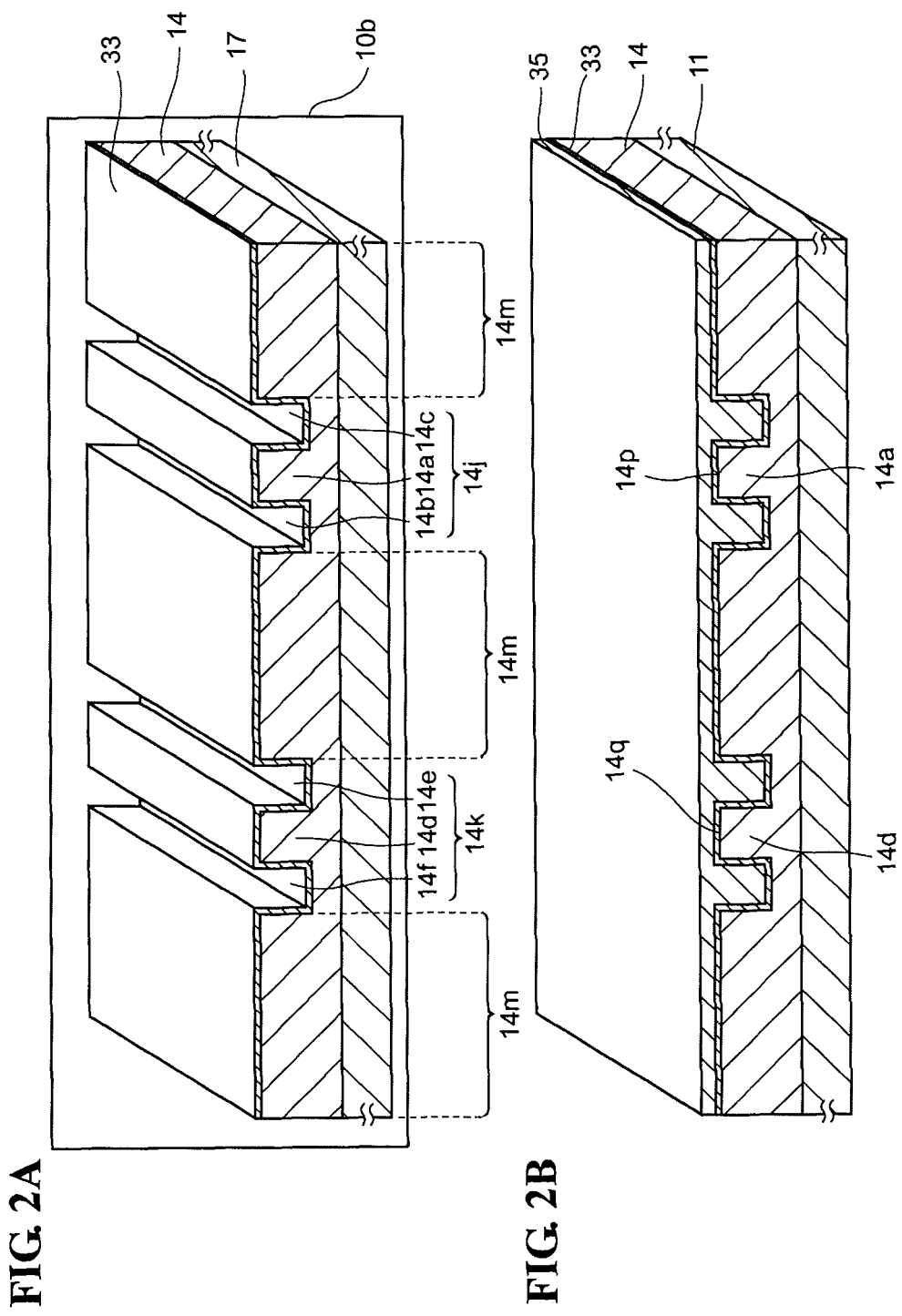

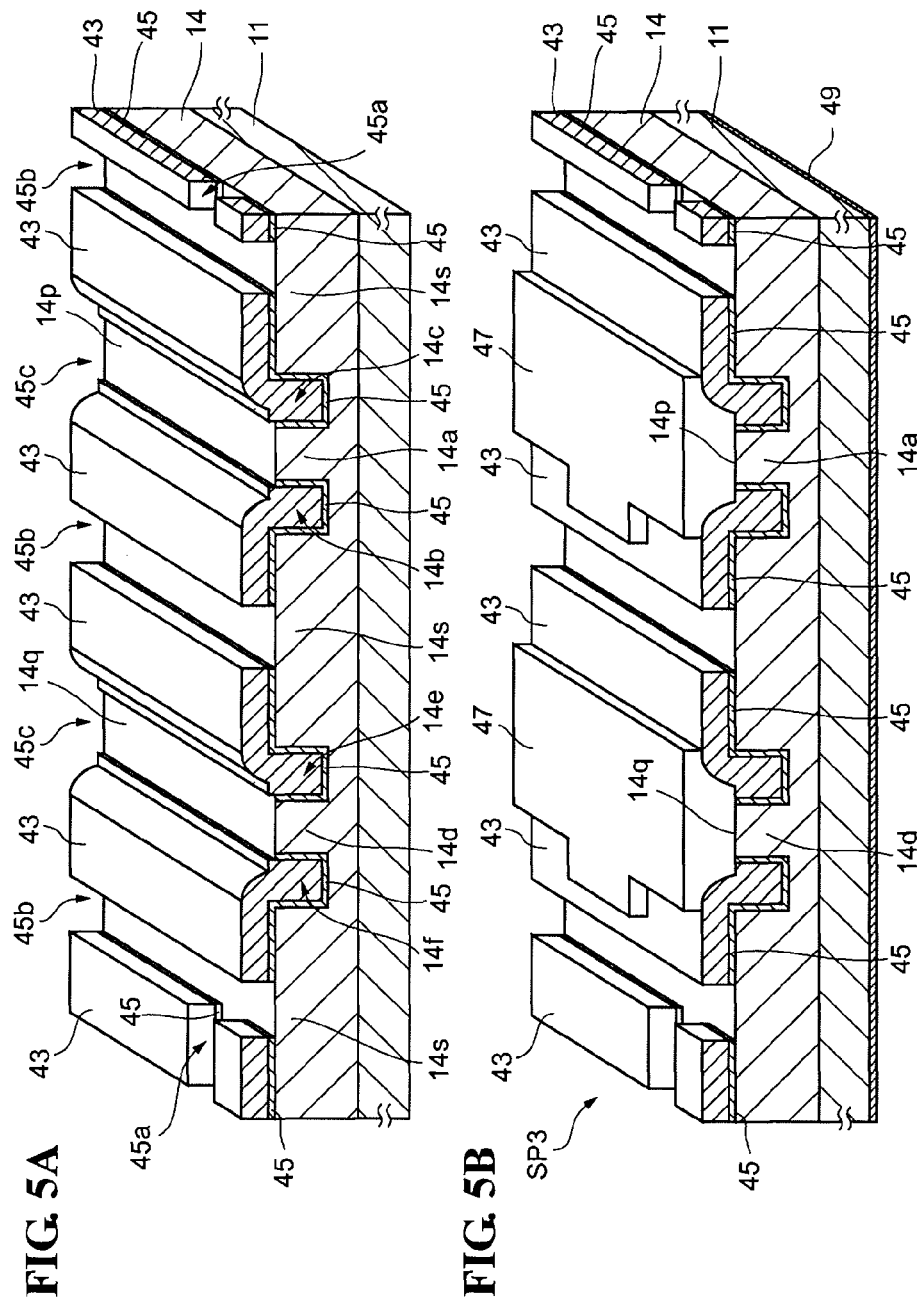

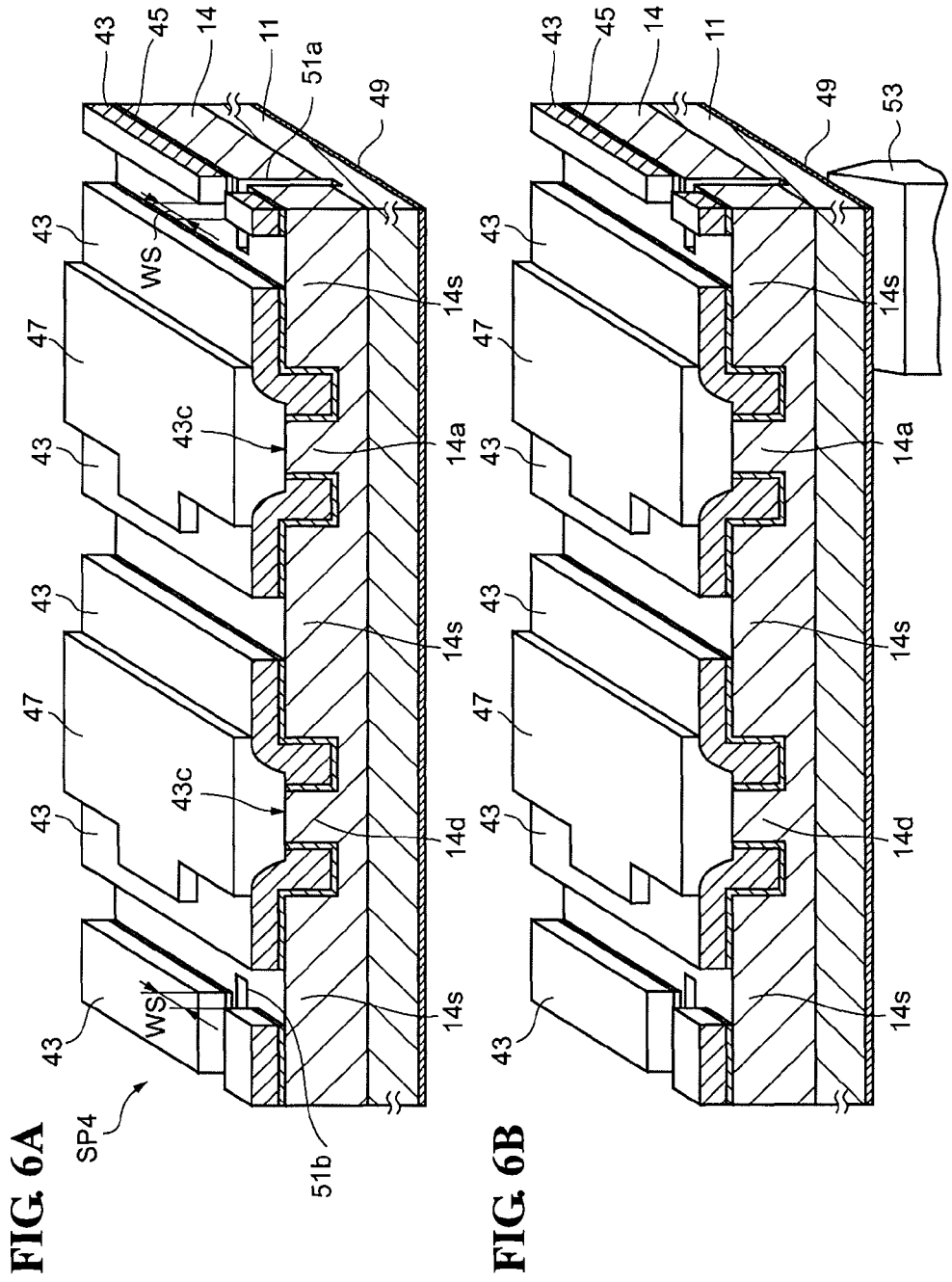

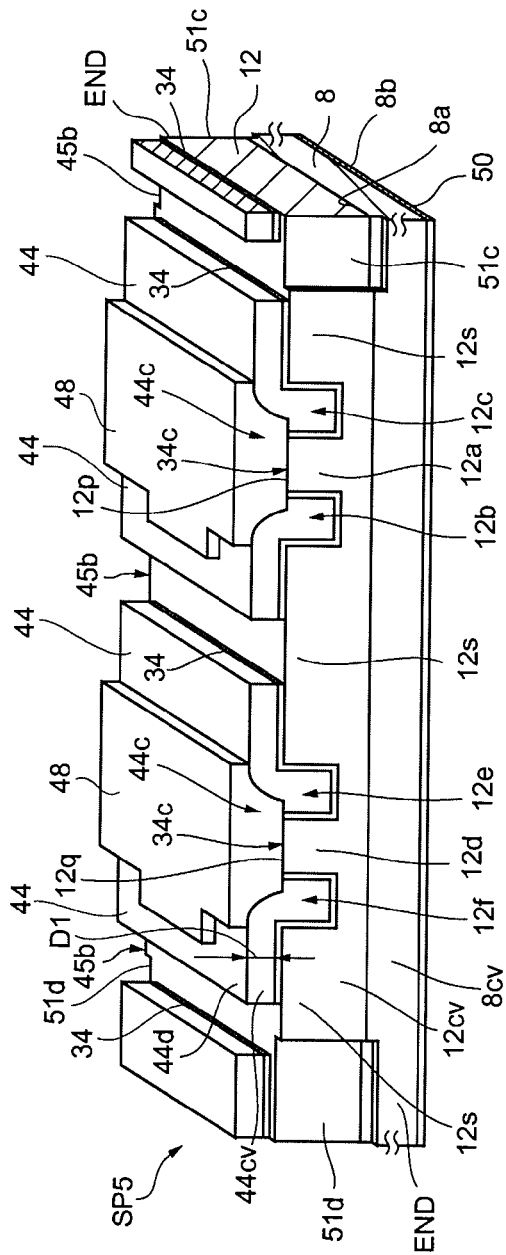
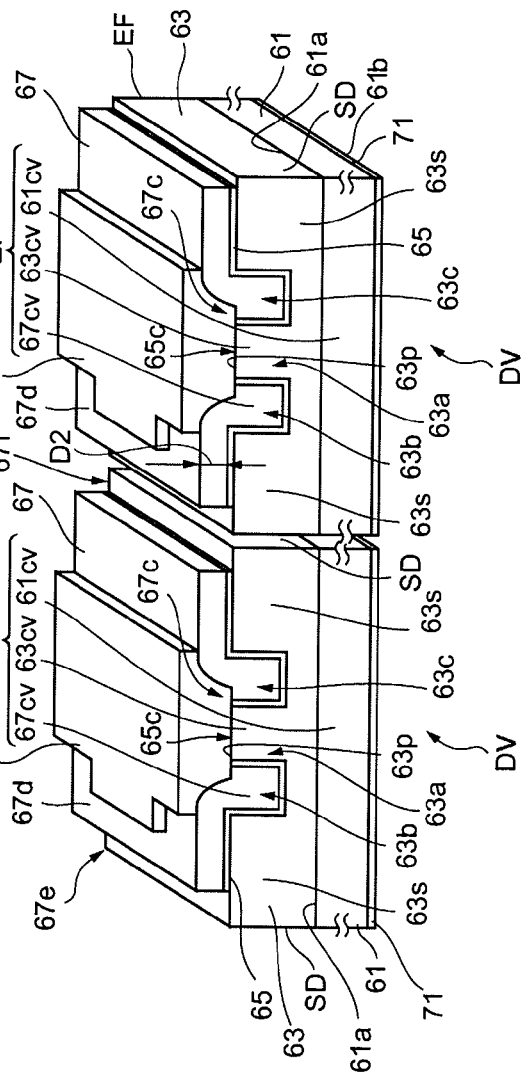
FIG. 7A
FIG. 7B

METHOD FOR PRODUCING SEMICONDUCTOR OPTICAL DEVICE AND SEMICONDUCTOR OPTICAL DEVICE

BACKGROUND OF THE INVENTION

1. Field of the Invention

The present invention relates to a method for producing a semiconductor optical device and a semiconductor optical device.

2. Description of the Related Art

Japanese Unexamined Patent Application Publication No. 2008-205025 discloses an optical semiconductor device and a method for producing the optical semiconductor device. In this method, a p-type contact layer and an upper cladding layer are processed into a ridge shape by dry etching or the like to form a ridge portion. A silicon oxide film having a thickness of 400 nm is then formed on the entire surface by chemical vapor deposition (CVD). Subsequently, a bisbenzocyclobutene (BCB) resin is applied to the entire surface and cured. Thus, a resin layer having a thickness of 2 μm is formed. The resin layer has a substantially flat surface. Next, a photoresist film is formed on the resin layer. The photoresist film covers a region other than a region that is located along the ridge portion and whose width is larger than that of the ridge portion. The resin layer and the silicon oxide film are successively etched using the photoresist film as a mask. Thus, the upper surface of the p-type contact layer located on the ridge portion is exposed. The photoresist film is then removed. Subsequently, a silicon nitride film having a thickness of 300 nm is formed on the entire surface by plasma CVD. A photoresist film is formed on the silicon nitride film, the photoresist film serving as a mask having a pattern that covers a region other than a region where a p-type electrode is to be formed. By etching the silicon nitride film using the mask, a contact window is formed above the ridge portion and the upper surface of the p-type contact layer is exposed. The photoresist film is then removed, and a p-type electrode is formed on the silicon nitride film and in the contact window. Except for the contact window region above the ridge portion, the surface of the substrate and the side surfaces of the ridge portion are embedded with the BCB resin.

SUMMARY OF THE INVENTION

A photosensitive BCB resin can be used as the resin with which the ridge portion (ridge structure) is embedded. When such a photosensitive BCB resin is used, a mask pattern can be directly formed in the photosensitive resin using a typical photolithographic technique. Therefore, a process of forming a photoresist film on a BCB resin layer can be omitted. The photosensitive BCB resin normally has the same characteristics as those of negative resists.

In the production process of semiconductor optical devices, a scribe line used to divide a semiconductor wafer including a plurality of semiconductor optical devices formed thereon into individual semiconductor optical chips is sometimes formed on the surface of a semiconductor wafer. When a ridge structure is embedded with, for example, a BCB resin or the like, the resin is formed on an entire surface of the semiconductor wafer including the ridge structure. Therefore, to form a scribe line on a surface of a semiconductor wafer, a resin disposed in a region where the scribe line is to be formed needs to be removed.

A method for removing a photosensitive BCB resin to form a scribe line is investigated in a process of forming an opening in a photosensitive BCB resin on a ridge structure. Specifically, after a ridge structure is formed, the photosensitive BCB resin is formed on a surface of a semiconductor wafer including the ridge structure. Herein, the side surfaces of the ridge structure are embedded with the photosensitive BCB resin. Subsequently, a photomask having a pattern is disposed on the photosensitive BCB resin, and the photosensitive BCB resin is exposed through the photomask. Since the photosensitive BCB resin has the same characteristics as those of negative resists as described above, a region where a scribe line is to be formed and an opening on the ridge structure are shielded from light. On the other hand, a region including the side surfaces of the ridge structure is exposed. The photosensitive BCB resin is then developed and the photosensitive BCB resin in the region where a scribe line is to be formed and in the opening on the ridge structure is removed.

However, in this production method, the areas of the photosensitive BCB resin in the region where a scribe line is to be formed and in the opening on the ridge structure are different from each other. In particular, the area of the photosensitive BCB resin in the region where a scribe line is to be formed is much larger than the area of the photosensitive BCB resin in the opening on the ridge structure. Therefore, it is difficult to completely remove the photosensitive BCB resin in the region where a scribe line is to be formed together with the photosensitive BCB resin in the opening on the ridge structure. To completely remove the photosensitive BCB resin in the region where a scribe line is to be formed, for example, the region needs to be completely shielded from light when the photosensitive BCB resin is exposed. Therefore, only the region where the side surfaces of the ridge structure are embedded with the photosensitive BCB resin is exposed through the photomask by decreasing the exposure area as much as possible. However, when such a small area is exposed, a shortage of exposure is easily caused and thus the nonuniform distribution of exposure is easily caused on the semiconductor wafer surface. In particular, a shortage of exposure is significantly caused near the side surfaces of the ridge structure. In this case, the photosensitive BCB resin is depressed after development and part of the side surfaces of the ridge structure is exposed. As a result, in the electrode forming step performed later, a metal of an electrode is in contact with a semiconductor layer at the side surfaces of the ridge structure, and a reaction between the metal and the semiconductor layer proceeds from the depressed portion into the ridge structure. Consequently, the reliability of devices is decreased.

A method for producing a semiconductor optical device according to the present invention includes the steps of (a) forming a semiconductor region on a substrate, the semiconductor region including a ridge structure; (b) forming an insulating film on the semiconductor region; (c) forming a non-photosensitive resin region on the insulating film, the non-photosensitive resin region having an opening on an upper surface of the ridge structure, the ridge structure being embedded with the non-photosensitive resin region; (d) forming a first mask on the non-photosensitive resin region, the first mask having an opening that defines a scribe area; (e) forming the scribe area by etching the non-photosensitive resin region using the first mask until the insulating film is exposed; (f) after removing the first mask, forming an insulating layer by etching the insulating film using the non-photosensitive resin region as a mask, the insulating layer having a first opening on the upper surface of the ridge structure and a second opening in the scribe area; (g) forming an electrode in the first opening of the insulating layer on the ridge structure and the non-photosensitive resin region to produce a substrate product; (h) forming a scribe line on a surface of the semiconductor region in the scribe area of the substrate product; and (i) cutting the substrate product along the scribe line to form a semiconductor laser bar. In addition, the second opening of the insulating layer in the scribe area is located outside a device region for the semiconductor optical device, and the electrode is in direct contact with the upper surface of the ridge structure through the first opening of the insulating layer.

In this production method, the opening located on the upper surface of the ridge structure is formed in the non-photosensitive resin region, and separately the opening that defines the scribe area is formed in the non-photosensitive resin region. Therefore, when the opening is formed on the upper surface of the ridge structure, processing suitable for forming the electrode can be performed on the non-photosensitive resin. Furthermore, an opening that allows the formation of the scribe line can be suitably formed in the non-photosensitive resin. In particular, there is a large difference in area between the opening of the non-photosensitive resin formed on the upper surface of the ridge structure and the opening of the non-photosensitive resin formed in the scribe area. In this production method, part of the non-photosensitive resin region is etched until the insulating film is exposed using the first mask that has an opening which defines the scribe area and covers the ridge structure in the device region. Thus, an opening of the non-photosensitive resin is formed in the scribe area through a process different from the process of forming the opening of the non-photosensitive resin on the upper surface of the ridge structure. The opening that defines the scribe area is located outside the device region for the semiconductor optical device.

In this production method, both the side surfaces of the ridge structure are embedded with the non-photosensitive resin region. The insulating layer has a first opening on the upper surface of the ridge structure and a second opening in the scribe area. The first and second openings of the insulating layer are formed by etching the insulating film at the corresponding openings of the non-photosensitive resin region to the first and second openings. The surface of the semiconductor region is exposed through the first opening of the insulating layer. Thus, the upper surface of the ridge structure can be in direct contact with a metal of an electrode through the first opening of the insulating layer. Furthermore, at the second opening of the insulating layer in the scribe area, a scribe line can be formed on a surface of the semiconductor region. Then, by cutting the substrate product along the scribe line, a semiconductor laser bar can be suitably formed.

Furthermore, the above-described shape of the non-photosensitive resin is formed without exposing the non-photosensitive resin. Thus, this production method is unrelated to the problems concerning the characteristics of the photosensitive resin such as a photosensitive BCB resin, and the ridge structure can be embedded with the non-photosensitive resin.

In the method for producing a semiconductor optical device according to the present invention, in the step of forming the scribe area, the non-photosensitive resin region is etched by reactive ion etching (RIE) using a mixed gas containing fluorocarbon and oxygen. In this production method, by processing the scribe area by RIE, a scribe area having a fine shape can be formed while the opening is made with high precision.

In the method for producing a semiconductor optical device according to the present invention, the step of forming the non-photosensitive resin region may include the steps of forming a non-photosensitive resin on the entire surface of the semiconductor region; forming a second mask on the non-photosensitive resin, the second mask having an opening above the upper surface of the ridge structure; forming the non-photosensitive resin region by etching the non-photosensitive resin using the second mask; and removing the second mask.

In this production method, the non-photosensitive resin is formed on the entire surface of the semiconductor region. Therefore, the upper surface and side surfaces of the ridge structure are covered with the non-photosensitive resin. Since the non-photosensitive resin is etched using the second mask having an opening above the upper surface of the ridge structure, the non-photosensitive resin region having an opening on the upper surface of the ridge structure can be formed while the ridge structure is embedded with the non-photosensitive resin. In addition, the second mask is removed. Therefore, the following processes can be performed, regardless of the pattern of the second mask.

In the method for producing a semiconductor optical device according to the present invention, in the step of forming the non-photosensitive resin region, the thickness of the non-photosensitive resin region is preferably less than 2.0 μm on the ridge structure. In this production method, the formation of both cleavage plane and fracture surface can be achieved with high yield.

In the method for producing a semiconductor optical device according to the present invention, the scribe area preferably extends in a direction crossing an extending direction of the ridge structure, and the width of the scribe area is preferably 5 μm or more. In this production method, a scribe line can be formed when the width is 5 μm or more.

In the method for producing a semiconductor optical device according to the present invention, the first mask may also have first and second openings that extend in an extending direction of the ridge structure; the non-photosensitive resin region may have first and second stripe-shape openings defined by the first and second openings of the first mask, respectively; and the opening of the non-photosensitive resin region may be formed between the first and second stripe-shape openings. The method may further include a step of separating the semiconductor laser bar into individual semiconductor optical devices at positions of the first and second stripe-shape openings.

In this production method, an opening for the scribe area can be formed while a separation area used to separate the semiconductor laser bar into individual semiconductor optical devices can be formed simultaneously.

In the method for producing a semiconductor optical device according to the present invention, the step of forming the semiconductor region may further include the steps of forming an epitaxial wafer including a plurality of semiconductor layers grown on the substrate; and forming first and second trenches that define the ridge structure by etching the epitaxial wafer using a trench mask. The insulating layer may cover side surfaces of the ridge structure and surfaces of the first and second trenches; the first and second trenches may be filled with the non-photosensitive resin region; the non-photosensitive resin region may cover the insulating layer located on the side surfaces of the ridge structure; the first trench may be defined by a first protruding portion and the ridge structure; the second trench may be defined by a second protruding portion and the ridge structure; the semiconductor region may include the first protruding portion, the second protruding portion, and the ridge structure; and the thickness of the non-photosensitive resin region may be 1.5 μm or less on the first and second protruding portions.

In this production method, the ridge structure can be protected by filling the trenches with the non-photosensitive resin having an opening formed on the ridge structure by etching. The thickness of the non-photosensitive resin in the trenches is gradually increased in directions from the ridge structure toward the protruding portions. However, the thickness of the non-photosensitive resin on the protruding portions is smaller than the thickness of the non-photosensitive resin in the trenches. The thickness of the non-photosensitive resin region on the first and second protruding portions is 1.5 µm or less. Therefore, when the substrate product is cut along the scribe line to form a semiconductor laser bar, the fracture surface of the non-photosensitive resin region is easily formed. Thus, a semiconductor laser bar can be obtained with high yield.

In the method for producing a semiconductor optical device according to the present invention, in the step of forming the scribe line, the scribe line may have a trench shape. In this production method, since the substrate product can be suitably cut along the scribe line, a semiconductor laser bar can be obtained with high yield.

In the method for producing a semiconductor optical device according to the present invention, in the step of forming the semiconductor laser bar, an end face of the semiconductor laser bar formed by cutting the substrate product may extend from an edge of a back of the substrate to an edge of an upper surface of the non-photosensitive resin region, and the end face of the semiconductor laser bar may include cleavage planes formed in the substrate and the semiconductor region and a fracture surface formed in the non-photosensitive resin region.

In this production method, at the end face of the semiconductor laser bar formed by cutting the substrate product, cleavage planes are formed in the substrate and the semiconductor region and a fracture surface is formed in the non-photosensitive resin region. The semiconductor region is composed of a semiconductor crystal and can be cleaved in a certain direction. On the other hand, the non-photosensitive resin region formed on the semiconductor region does not have cleavability. The substrate product includes the semiconductor region that can be cleaved and the non-photosensitive resin region having no cleavability. However, in this production method, a cleavage plane that extends along the cleavage line defined by the scribe line and a fracture surface that extends along the cleavage line can be formed even in the substrate product including the semiconductor region having cleavability and the non-photosensitive resin region having no cleavability.

In the method for producing a semiconductor optical device according to the present invention, the non-photosensitive resin region may be composed of a non-photosensitive bisbenzocyclobutene resin. The non-photosensitive resin region may be composed of a non-photosensitive polymer containing silicon.

BRIEF DESCRIPTION OF THE DRAWINGS

FIGS. 2A and 2B schematically show principal processes in the method for producing a semiconductor optical device according to this embodiment.

FIGS. 5A and 5B schematically show principal processes in the method for producing a semiconductor optical device according to this embodiment.

FIGS. 6A and 6B schematically show principal processes in the method for producing a semiconductor optical device according to this embodiment.

FIGS. 7A and 7B schematically show a semiconductor laser bar for a semiconductor optical device and a semiconductor optical device according to this embodiment, respectively.

DESCRIPTION OF THE PREFERRED EMBODIMENTS

Figures 1A, 1B:
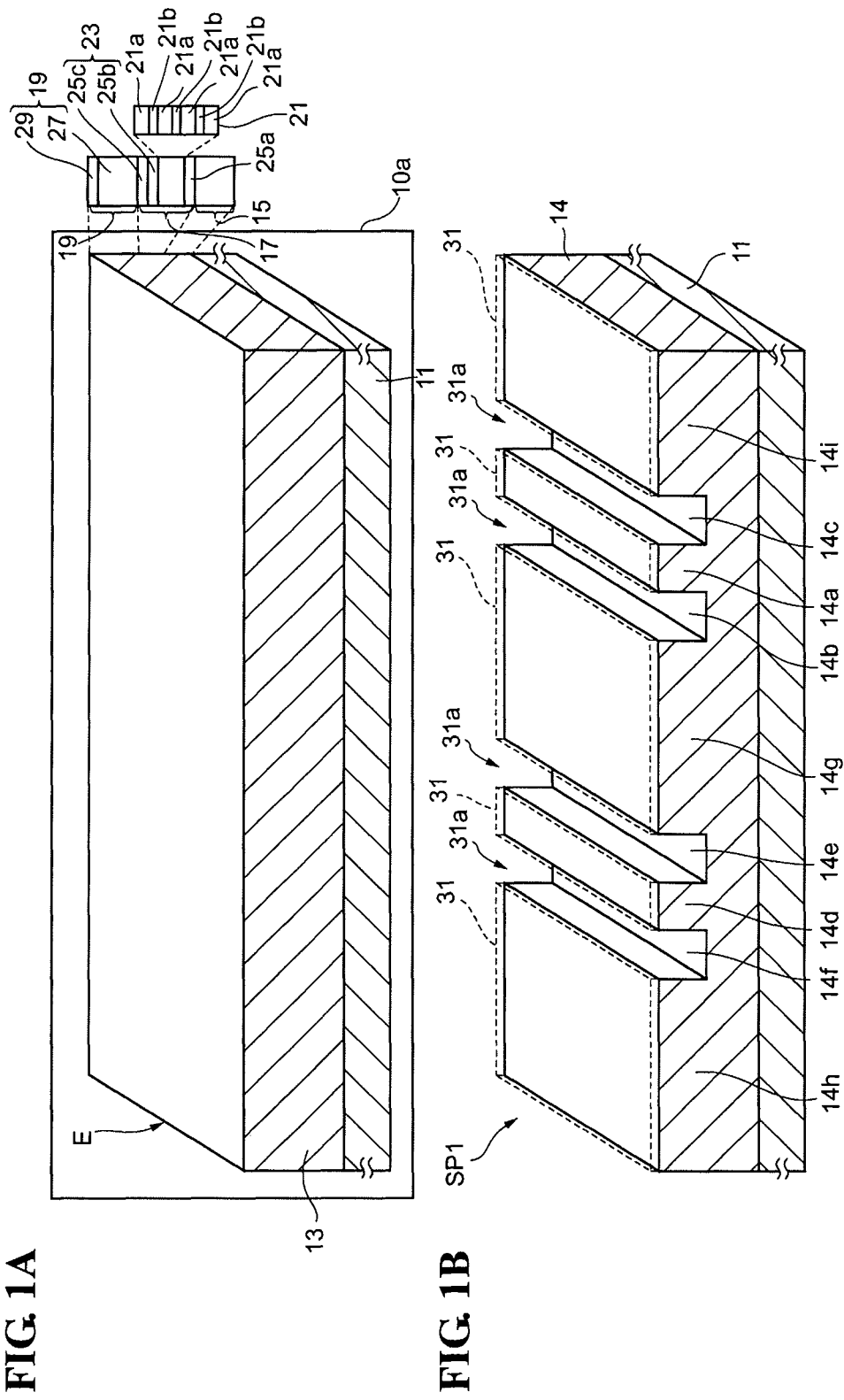
FIGS. 1A and 1B schematically show principal processes in a method for producing a semiconductor optical device according to this embodiment.

An embodiment of a method for producing a semiconductor optical device and a semiconductor optical device according to the present invention will now be described with reference to the attached drawings. If possible, the same parts are denoted by the same reference numerals.

FIGS. 1A to 6B show principal processes in the method for producing a semiconductor optical device according to this embodiment. In the processes below, a semiconductor laser is produced as an example of the semiconductor optical device. As shown in FIG. 1A, an epitaxial wafer E is formed. First, a substrate 11 is prepared. The substrate 11 is a semiconductor substrate composed of, for example, GaAs or InP. The substrate 11 is loaded in a growth furnace 10a and then a stack of semiconductor layers 13 is formed on the substrate 11. The stack of semiconductor layers 13 includes an n-type group III-V compound semiconductor region 15, an active region 17, and a p-type group III-V compound semiconductor region 19. The active region 17 includes, for example, an active layer 21 and/or a grating region 23. The active layer 21 has, for example, a multi quantum well (MQW) structure in which barrier layers 21a and well layers 21b are alternately stacked. The refractive index of the active layer 21 is larger than those of the n-type group III-V compound semiconductor region 15 and the p-type group III-V compound semiconductor region 19. The active layer 21 is formed between an optical confinement layer 25a and an optical confinement layer 25b. The grating region 23 includes the optical confinement layer 25b and a grating layer 25c. The p-type group III-V compound semiconductor region 19 includes a p-type cladding layer 27 and a p-type contact layer 29.

In the embodiment, the stack of semiconductor layers 13 is formed as follows. First, an n-type InP substrate is prepared. An n-type InP cladding layer, an n-type AlGaInAs optical confinement layer (band gap wavelength: 1.10 µm), a non-doped AlGaInAs multi quantum well structure (a well layer having a thickness of 6 nm and a band gap wavelength of 1.31 µm and a barrier layer having a thickness of 9 nm and a band gap wavelength of 1.10 µm), a non-doped AlGaInAs optical confinement layer (band gap wavelength: 1.10 µm), a p-type AlInAs carrier stop layer, and a p-type GaInAsP grating layer (band gap wavelength: 1.2 µm) are grown on the n-type InP substrate by a metal-organic vapor phase epitaxy (MOVPE) method. In the process of producing a distributed feedback semiconductor laser, a grating structure is formed in the p-type GaInAsP grating layer by electron beam exposure and dry etching. After the grating structure is formed, a p-type InP cladding layer and a p-type GaInAs contact layer are regrown. In the process of producing a Fabry Perot laser, a grating structure is not formed, and an AlInAs carrier stop layer is grown and then a p-type InP cladding layer and a p-type GaInAs contact layer are grown. In a semiconductor optical device fabricated on an InP substrate, the active layer can be composed of GaInAsP, AlGaInAs, GaInAs or the like. The semiconductor optical device (semiconductor laser) fabricated on the InP substrate may emit a light with a wavelength of 1.3 to 1.55 μm as an optical source for optical fiber communication systems. In a semiconductor optical device fabricated on a GaAs substrate, the active layer can be composed of GaAs, GaAlAs, GaInAs, GaInNAs or the like. Instead of the quantum well structure, a quantum dot structure composed of InAs or the like may also be used.

As shown in FIG. 1B, trenches 14b, 14c, 14e, and 14f are formed so as to define ridge structures 14a and 14d. To form these trenches, a mask 31 (trench mask indicated by a broken line) having openings that extend in the extending direction of the ridge structures is formed on a surface of the epitaxial wafer E including a plurality of group III-V compound semiconductor layers. The mask 31 has, for example, stripe-shape openings 31a. The mask 31 can be composed of, for example, a silicon nitride (SiN) film or a silicon oxide ($SiO_2$) film. In the embodiment, after a SiN film having a thickness of 300 nm is deposited by chemical vapor deposition (CVD), a resist mask having a pattern for forming the ridge structures is formed by photolithography. Then, the insulating film is etched through the resist mask as an etching mask by reactive ion etching (RIE) to form the mask 31. The pattern of the resist mask is transferred onto the insulating film. In the RIE process, $CF_4$ gas is used as an etching gas. The resist mask is then removed by $O_2$ ashing.

The epitaxial wafer E is etched using the mask 31 to form the trenches 14b, 14c, 14e, and 14f that define the ridge structures 14a and 14d. An etching depth in forming the trenches 14b, 14c, 14e, and 14f reaches the p-type cladding layer 27, for example. In this case, the active region 17 is not etched, and the ridge structures 14a and 14d are disposed on the active region 17. The ridge structures 14a and 14d include the p-type group III-V compound semiconductor region 19 that includes a p-type cladding layer 27 and a p-type contact layer 29. In addition, an etching depth in forming the trenches 14b, 14c, 14e, and 14f may reach the n-type group III-V compound semiconductor region 15. In this case, the ridge structures 14a and 14d include the p-type group III-V compound semiconductor region 19, the active region 17, and the n-type group III-V compound semiconductor region 15, whereby the ridge structures 14a and 14d constitute a stripe mesa structure. By removing the mask 31 after the etching, a substrate product SP1 is obtained. The ridge structure 14a is sandwiched by the trenches 14b and 14c and the ridge structure 14d is sandwiched by the trenches 14e and 14f. The substrate product SP1 includes a protruding region 14g formed between the trenches 14b and 14e. The substrate product SP1 also includes a protruding region 14h on one end thereof and a protruding region 14i on the other end thereof. The protruding region 14i, the trench 14c, the ridge structure 14a, the trench 14b, the protruding region 14g, the trench 14e, the ridge structure 14d, the trench 14f, and the protruding region 14h are arranged in that order in a direction crossing the extending direction of the ridge structures 14a and 14d.

In the step of forming the trenches on the epitaxial wafer E, when the epitaxial wafer E is formed on an InP substrate, epitaxial layers are etched by RIE using a mixed gas of $CH_4$ gas and $H_2$ gas as an etching gas, for example. On the other hand, when the epitaxial wafer E is formed on a GaAs substrate, epitaxial layers are etched by RIE using a Cl-based etching gas such as chlorine gas ($Cl_2$ gas), for example. After the etching, wet cleaning is performed to remove a damaged layer resulting from the dry etching (RIE). The mask composed of the insulating film (SiN) is removed with buffered hydrofluoric acid.

As shown in FIG. 2A, an insulating film 33 is formed on a semiconductor region 14 that has been disposed on the substrate 11 in a CVD apparatus 10b. The insulating film 33 can be composed of, for example, a silicon oxide film ($SiO_2$ film) or a silicon nitride film (SiN film). The insulating film 33 has a thickness of, for example, 350 nm. The semiconductor region 14 includes first regions 14j and 14k and second regions 14m. The first region 14j includes the ridge structure 14a and the trenches 14b and 14c. The first region 14k includes the ridge structure 14d and the trenches 14e and 14f. The width of the trenches is, for example, 12 to 23 μm. The width of the ridge structures is, for example, 1.0 to 1.5 μm.

After the insulating film 33 is formed, a non-photosensitive resin region having openings on the upper surfaces 14p and 14q of the respective ridge structures 14a and 14d is formed while the ridge structures 14a and 14d are embedded with the non-photosensitive resin region. In this embodiment, a non-photosensitive bisbenzocyclobutene (BCB) resin can be used as the non-photosensitive resin. Hereinafter, a method for forming the non-photosensitive resin region composed of a non-photosensitive BCB resin will be described.

As shown in FIG. 2B, a non-photosensitive BCB resin is formed on the entire surface of the semiconductor region 14 and then cured to form a non-photosensitive BCB resin region 35. The curing is performed in a $N_2$ atmosphere at 295° C. for 6 minutes. In consideration of a reduction in the thickness of a film caused by etching performed later, the thickness of the non-photosensitive BCB resin region 35 is preferably less than 2.0 μm on the ridge structures 14a and 14d. The non-photosensitive BCB resin region 35 covers the surfaces of the trenches 14b, 14c, 14e, and 14f.

Figure 3A:
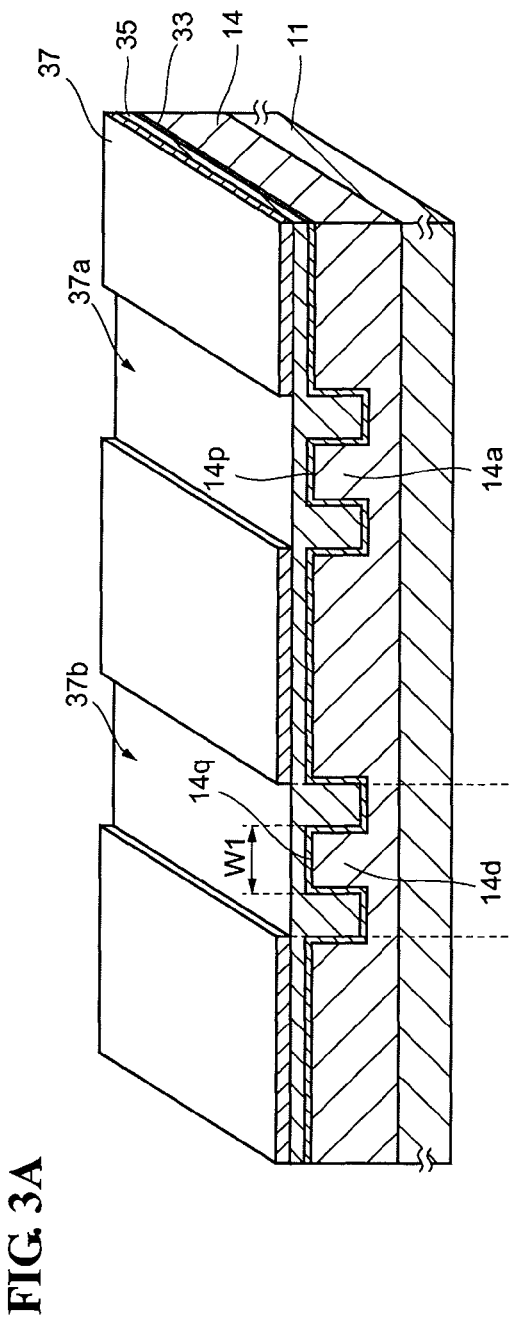
FIGS. 3A and 3B schematically show principal processes in the method for producing a semiconductor optical device according to this embodiment.

As shown in FIG. 3A, a mask 37 having openings 37a and 37b is formed on the non-photosensitive BCB resin region 35. In the embodiment, the mask 37 is a second mask. The openings 37a and 37b of the mask 37 are located above the upper surfaces 14p and 14q of the ridge structures 14a and 14d, respectively. The mask 37 can be composed of, for example, a resist. The openings 37a and 37b have a stripe shape that extends in the extending direction of the ridge structures. The width W2 of the stripe shape is larger than the width W1 of the upper surfaces 14p and 14q of the respective ridge structures 14a and 14d.

Figure 3B:
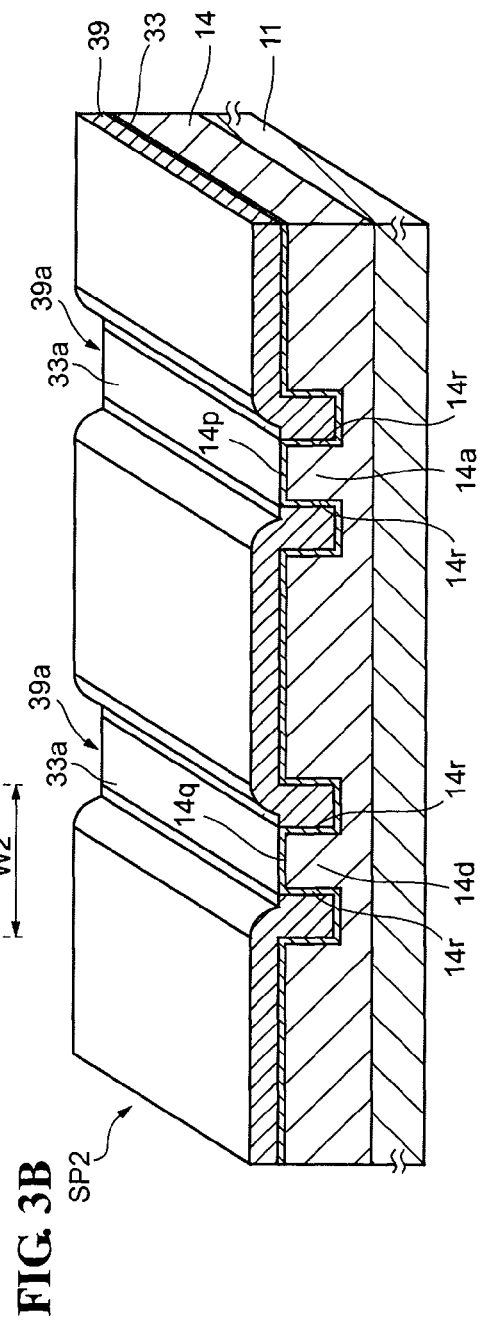

As shown in FIG. 3B, the non-photosensitive BCB resin region 35 is etched using the mask 37 by dry etching to form a non-photosensitive BCB resin region 39. In this process, a substrate product SP2 is formed. The resin located on the ridge structures is removed by this etching, and openings 39a are formed. The upper portions 33a of the insulating film 33 located on the upper surfaces 14p and 14q of the respective ridge structures 14a and 14d are exposed at the openings 39a. In the semiconductor device region, the width of the trenches formed along the ridge structures is preferably constant. After the etching is completed, the mask 37 is removed. The non-photosensitive BCB resin located on the ridge structures is removed using a resist mask by RIE using a mixed gas of $CF_4$ gas and $O_2$ gas as an etching gas, for example.

In this production method, the non-photosensitive BCB resin is formed on the entire surface of the semiconductor region 14. Therefore, the upper surfaces 14p and 14q and side surfaces 14r of the ridge structures 14a and 14d are covered with the non-photosensitive BCB resin. Furthermore, the non-photosensitive BCB resin is etched using the mask 37 having openings above the upper surfaces 14p and 14q of the respective ridge structures 14a and 14d. Therefore, the non-photosensitive BCB resin region 39 having openings on the upper surfaces 14p and 14q of the respective ridge structures 14a and 14d can be formed while the ridge structures 14a and 14d are embedded with the non-photosensitive BCB resin region 39. In addition, the mask 37 is removed. Therefore, the following processes can be performed, regardless of the pattern of the mask 37.

Subsequently, the non-photosensitive BCB resin region 39 is processed to expose scribe areas located outside the device region for the semiconductor optical device. A process for exposing the scribe areas will now be described.

Figures 4A, 4B:
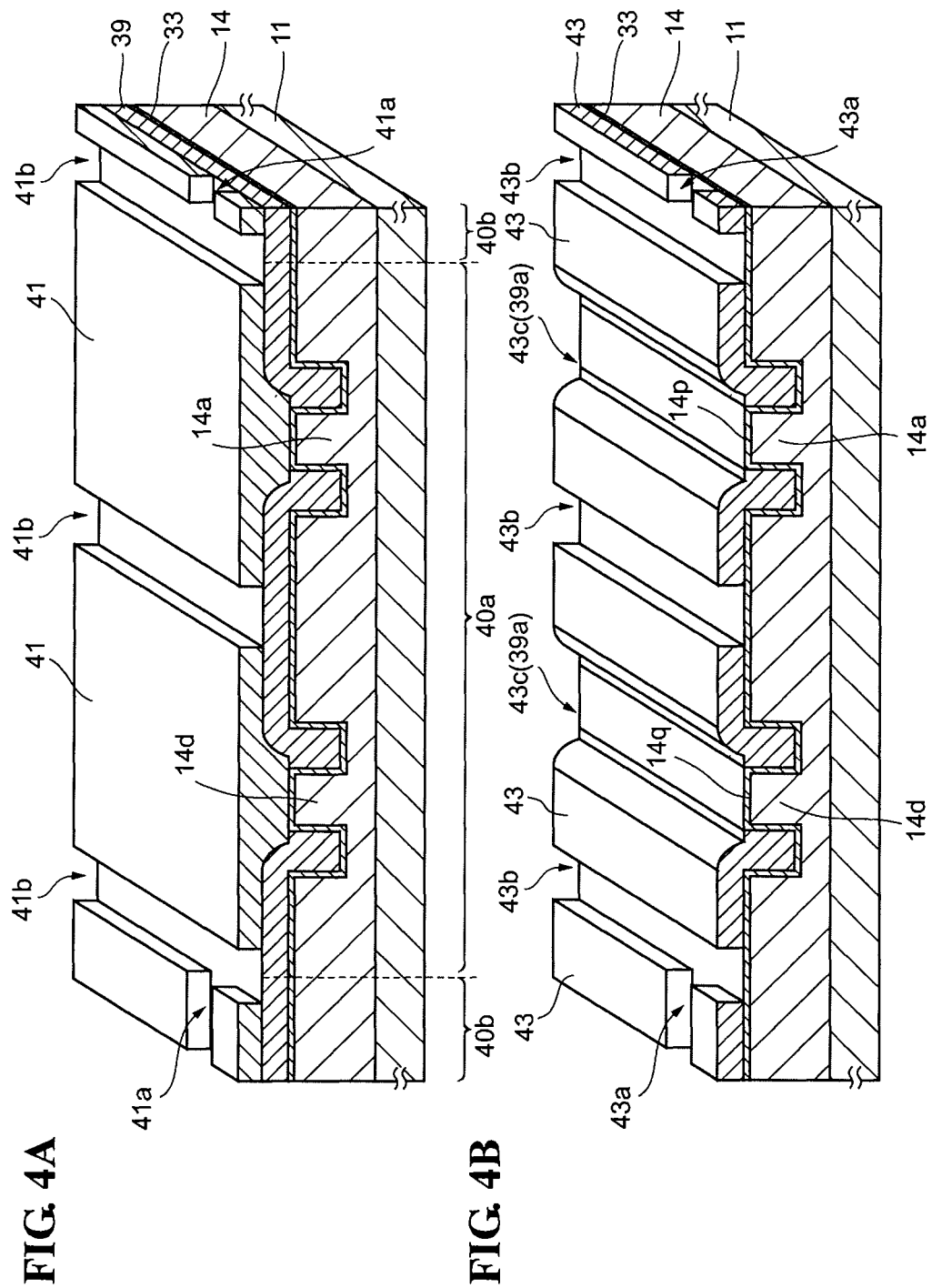
FIGS. 4A and 4B schematically show principal processes in the method for producing a semiconductor optical device according to this embodiment.

As shown in FIG. 4A, a mask 41 that defines the scribe areas is formed. The mask 41 has openings 41a that define the scribe areas located on device region outer sides 40b. In the embodiment, the mask 41 is a first mask. In addition, the mask 41 covers the non-photosensitive BCB resin region 39 in a device region 40a. The mask 41 can be composed of for example, a resist. The openings 41a each extend in a direction crossing the extending direction of the ridge structures 14a and 14d.

As shown in FIG. 4B, the non-photosensitive BCB resin region 39 is etched using the mask 41 to expose the insulating film 33 in the scribe areas. The non-photosensitive BCB resin is preferably etched by dry etching (RIE) that uses, for example, an etchant containing fluorocarbon and oxygen gas. By etching the non-photosensitive BCB resin by dry etching, scribe areas having a fine shape can be formed while the opening is made with high precision. After the etching, the mask 41 is removed. Since the mask 41 having openings that define the scribe areas and covering the device region is used, the non-photosensitive BCB resin is easily etched. A non-photosensitive BCB resin region 43 has openings 43a for the scribe areas, and the openings 43a extend in a direction crossing the extending direction of the ridge structures 14a and 14d. The insulating film 33 is exposed in the openings 43a.

If necessary, as shown in FIG. 4A, the mask 41 may include openings 41b that extend in the extending direction of the ridge structures 14a and 14d. In the embodiment, the openings 41b correspond to first and second openings of the first mask. In this case, as shown in FIG. 4B, the non-photosensitive BCB resin region 43 can have stripe-shape openings 43b defined by the openings 41b of the mask 41. Openings 39a (also referred to as the openings 43c of the non-photosensitive BCB resin region 43) are each formed between the stripe-shape openings 43b. In the embodiment, the stripe-shape openings 43b correspond to first and second stripe-shape openings. In a later process, a semiconductor laser bar is separated into individual chips at positions of the stripe-shape openings 43b, and thus semiconductor optical devices are obtained. In this production method, openings for the scribe areas can be formed while separation areas used to separate a semiconductor laser bar into individual semiconductor optical devices can be formed simultaneously.

As shown in FIG. 5A, after the scribe areas are exposed, the insulating film 33 is etched using the non-photosensitive BCB resin region 43 as a mask to form an insulating layer 45. The insulating layer 45 has openings 45a, 45b, and 45c. The openings 45a, 45b, and 45c are formed in a self-aligned manner at the openings of the non-photosensitive BCB resin region, the openings being individually formed through two photolithographic processes. The openings 45a are formed in the scribe areas, and the upper surface of the semiconductor region 14 is exposed in the openings 45a. Therefore, a scribe trench can be formed in each of the scribe areas. The openings 45b are formed for separation areas and used to separate a formed semiconductor laser bar into semiconductor optical devices. The openings 45c are formed as the openings 43c of the non-photosensitive BCB resin region 43 (the openings 39a of the non-photosensitive BCB resin region 39) so as to provide a contact between an electrode and the semiconductor region 14. In the embodiment, the opening 45a is a second opening of the insulating layer in the scribe area, and the opening 45c is a first opening of the insulating layer on the upper surface of the ridge structure.

The insulating layer 45 covers the side surfaces 14r of the ridge structures 14a and 14d. The trenches 14b, 14c, 14e, and 14f are filled with the non-photosensitive BCB resin region 43 and the non-photosensitive BCB resin region 43 covers the insulating layer 45 located on the side surfaces 14r of the ridge structures 14a and 14d. The trenches 14b, 14c, 14e, and 14f are defined by protruding portions 14s and the ridge structures 14a and 14d.

As shown in FIG. 5B, after the insulating layer 45 is formed, electrodes 47 are formed on the ridge structures 14a and 14d and the non-photosensitive BCB resin region 43. Another electrode 49 is formed on the back of the substrate 11. The electrodes 47 can be formed by, for example, a lift-off method. The electrodes 47 are each in ohmic contact with the upper surface of the ridge structure through the opening 43c of the non-photosensitive BCB resin region 43. Through these processes, a substrate product SP3 is produced.

After the electrodes 47 and 49 are formed, scribe lines 51a and 51b are formed in the scribe areas as shown in FIG. 6A. In the embodiment, the scribe lines 51a and 51b each having a trench shape are formed on an epitaxial surface (the surface of the semiconductor region 14). On a cleavage line that connects the scribe lines 51a and 51b to each other, the non-photosensitive BCB resin region 43 is left on the semiconductor region 14 to protect the ridge structures 14a and 14d. The scribe areas each extend in a direction crossing the extending direction of the ridge structures 14a and 14d. The scribe lines 51a and 51b can be formed with, for example, a laser scriber or a diamond scribing tool. Through these processes, a substrate product SP4 is produced.

The width WS of the scribe area is preferably 5 μm or more to form a scribe line. The width WS of the scribe area is preferably 20 μm or less.

As shown in FIG. 6B, the substrate product SP4 is cleaved along the scribe lines 51a and 51b to form a semiconductor laser bar. For example, with a semiconductor laser bar producing apparatus including a blade 53, the semiconductor laser bar is formed by pressing the blade 53 against the substrate surface of the substrate product SP4.

The thickness of the non-photosensitive BCB resin region 43 is preferably 0.5 μm or more. When the thickness is 0.5 μm or more, the non-photosensitive BCB resin functions as a protective film in the step of mounting a semiconductor optical device on a sub-mount or package. The thickness of the non-photosensitive BCB resin region 43 is preferably 1.5 μm or less on the protruding portions 14s.

In this production method, the ridge structures 14a and 14d can be protected by filling the trenches with the non-photosensitive BCB resin. The thickness of the non-photosensitive BCB resin in the trenches is gradually increased in directions from the ridge structures 14a and 14d toward the protruding portions 14s. However, the thickness of the non-photosensitive BCB resin on the protruding portions 14s is smaller than the thickness of the non-photosensitive BCB resin in the trenches. Since the thickness of the non-photosensitive BCB resin region 43 on the protruding portions 14s is 1.5 μm or less, the non-photosensitive BCB resin region 43 is easily cut in the formation of semiconductor laser bars. Thus, a semiconductor laser bar can be obtained with high yield.

FIG. 7A shows a semiconductor laser bar SP5. The semiconductor laser bar SP5 includes cleavage planes 8cv and 12cv formed in the substrate 11 and the semiconductor region 14, respectively, in the formation of semiconductor laser bars.

The semiconductor laser bar SP5 also includes a fracture surface 44cv formed in the non-photosensitive BCB resin region 43.

In this production method, the non-photosensitive BCB resin region 39 having the openings 39a on the upper surfaces 14p and 14q of the respective ridge structures 14a and 14d is formed, and separately the non-photosensitive BCB resin region 39 is processed to expose the scribe areas. Therefore, the non-photosensitive BCB resin can be processed so that the openings 43c on the upper surfaces of the ridge structures have a tapered shape that is suitable for the electrodes 47. In addition, the openings 43a that allow the formation of the scribe lines can be formed in the non-photosensitive BCB resin. There is a large difference in the processed area between the process of exposing the upper surfaces 14p and 14q and the process of exposing the scribe areas. Thus, both the processes are not performed in a single step, whereby proper openings can be formed individually. Therefore, the reliability is improved.

The ridge structures 14a and 14d are embedded with the non-photosensitive BCB resin region 43, and the non-photosensitive BCB resin region 43 has the openings 43c on the upper surfaces 14p and 14q of the ridge structures. In this production method, the scribe areas can be exposed, the scribe lines can be formed, and the semiconductor laser bar can be formed by performing cleavage along the scribe lines. Therefore, the cleavage planes 8cv and 12cv are respectively formed in the substrate 11 and the semiconductor region 14 and the fracture surface 44cv is formed in the non-photosensitive BCB resin region 43. That is, in the substrate product including the semiconductor region 14 having cleavability and the non-photosensitive BCB resin region 43 having no cleavability, cleavage planes that extend along the cleavage line defined by the scribe lines 51a and 51b and a fracture surface that extends along the cleavage line can be formed.

Furthermore, the non-photosensitive BCB resin having the above-described shape is formed without exposing the non-photosensitive BCB resin. Thus, this production method is unrelated to the problems concerning the exposure characteristics of the embedded resin.

The semiconductor laser bar SP5 includes a substrate 8, a semiconductor region 12, a insulating layer 34, a non-photosensitive BCB resin body 44, electrodes 48, and another electrode 50. The semiconductor region 12 includes protruding portions 12s and ridge structures 12a and 12d that define trenches 12b, 12c, 12e, and 12f and is formed on a principal surface 8a of the substrate 8. The insulating layer 34 has openings 34c on the upper surfaces 12p and 12q of the ridge structures and is formed on the semiconductor region 12. The non-photosensitive BCB resin body 44 has openings 44c on the upper surfaces 12p and 12q of the ridge structures and is formed on the protruding portions 12s. Moreover, the trenches 12b, 12c, 12e, and 12f are filled with the non-photosensitive BCB resin body 44 so that the ridge structures 12a and 12d are embedded with the non-photosensitive BCB resin body 44. The electrodes 48 are formed on the non-photosensitive BCB resin body 44 and the upper surfaces 12p and 12q of the ridge structures. In addition, the electrodes 48 are in direct contact with the top surface of the ridge structures 12a and 12d through the openings 34c of the insulating layer 34 to form an ohmic contact. The thickness D1 of the non-photosensitive BCB resin body 44 is less than 2.0 μm on the protruding portions 12s. Each of the end faces END of the semiconductor laser bar SP5 extends from the edge of the back 8b of the substrate 8 to the edge of the upper surface 44d of the non-photosensitive BCB resin body 44. The end face END includes a fracture surface 44cv of the non-photosensitive BCB resin body 44, a cleavage plane 8cv of the substrate 8, and a cleavage plane 12cv of the semiconductor region 12. Traces 51c and 51d of the scribe lines each having a trench shape are left on the end faces END of the semiconductor laser bar SP5.

A dielectric multilayer film may be optionally formed on the fracture surface 44cv of the non-photosensitive BCB resin body 44, the cleavage plane 8cv of the substrate 8, and the cleavage plane 12cv of the semiconductor region 12. The dielectric multilayer film functions as an anti-reflection coating film (AR film) or a high-reflection film (HR film).

The semiconductor laser bar SP5 is individually separated at positions of the stripe-shape openings 45b into semiconductor optical devices DV shown in FIG. 7B.

Each of the semiconductor optical devices DV includes a substrate 61, a semiconductor region 63, an insulating layer 65, a non-photosensitive BCB resin body 67, an electrode 69, and another electrode 71. The semiconductor region 63 is formed on a principal surface 61a of the substrate 61. The semiconductor region 63 includes a ridge structure 63a and trenches 63b and 63c. The trenches 63b and 63c are defined by the ridge structure 63a and protruding portions 63s. The insulating layer 65 is formed on the semiconductor region 63 and has an opening 65c at a position of the upper surface 63p of the ridge structure. The non-photosensitive BCB resin body 67 is formed on the protruding portions 63s and has an opening 67c on the upper surface 63p of the ridge structure. Furthermore, the trenches 63b and 63c are filled with the non-photosensitive BCB resin body 67 so that the ridge structure 63a is embedded with the non-photosensitive BCB resin body 67. The electrode 69 is formed on the non-photosensitive BCB resin body 67 and the upper surface 63p of the ridge structure. In addition, the electrode 69 is in direct contact with the top surface of the ridge structure 63a through the opening 65c of the insulating layer 65 to form an ohmic contact. The thickness D2 of the non-photosensitive BCB resin body 67 is less than 2.0 μm on the protruding portions 63s. The end face EF of the semiconductor optical device DV extends from the edge of the back 61b of the substrate 61 to the edge of the upper surface 67d of the non-photosensitive BCB resin body 67. The end face EF includes a fracture surface 67cv of the non-photosensitive BCB resin body 67, a cleavage plane 61cv of the substrate 61, and a cleavage plane 63cv of the semiconductor region 63.

According to this semiconductor optical device DV, the ridge structure 63a is embedded with the non-photosensitive BCB resin body 67 without problems concerning the exposure characteristics of the embedded resin. Moreover, the non-photosensitive BCB resin body 67 is formed on the protruding portions 63s and the thickness D2 of the non-photosensitive BCB resin body 67 is less than 2.0 μm on the protruding portions 63s. Therefore, the end face EF can include the fracture surface 67cv and the cleavage planes 61cv and 63cv.

In this semiconductor optical device DV, the non-photosensitive BCB resin body 67 has openings 67e and 67f formed along the upper edges of the side surfaces SD of the semiconductor optical device DV. The upper surface of the semiconductor region 63 is exposed due to the openings 67e and 67f. The fracture surface 67cv extends from one of the pair of openings 67e and 67f to the other. In this semiconductor optical device DV, the non-photosensitive BCB resin body 67 has the openings 67e and 67f formed along the upper edges of the side surfaces SD. Therefore, semiconductor optical devices DV can be obtained from the semiconductor laser bar SP5 with high yield. Since the fracture surface 67cv extends from one of the pair of openings 67e and 67f to the other, the ridge structure 63a is embedded with the non-photosensitive BCB resin body 67 on the end face EF and thus is properly protected. When the semiconductor optical device DV does not have the openings 67e and 67f to be formed along the upper edges of the side surfaces SD, the fracture surface 67cv extends from one of the pair of side surfaces SD to the other. Even in this case, the ridge structure 63a is embedded with the non-photosensitive BCB resin body 67 and thus is properly protected.

In this production method, as shown in FIG. 5A, when the insulating film 33 is etched in a self-aligned manner using the non-photosensitive BCB resin region 43 as a mask, the non-photosensitive BCB resin region 43 has stripe-shape openings 43c formed along the ridge structures, but does not have an opening that extends along the cleavage line. By leaving the non-photosensitive BCB resin region 43 on the cleavage line, the etching of the insulating film 33 can be avoided. That is, in the embodiment, the insulating film 33 is left along the cleavage line in the device region. Thus, since the semiconductor region is not exposed along the cleavage line near the ridge structures, a decrease in the reliability caused by the exposure of the semiconductor region can be avoided. In the embodiment, scribe lines are directly formed on the upper surface of the semiconductor region to form semiconductor laser bars by causing cleavage from the scribe lines. Therefore, the non-photosensitive BCB resin in the scribe areas is removed and the non-photosensitive BCB resin region near the ridge structures is left. As a result, the non-photosensitive BCB resin region can be formed along the ridge structures, and the ridge structures are embedded with the non-photosensitive BCB resin region even at the end faces of the semiconductor laser bars.

On the cleavage line, openings are formed in the non-photosensitive BCB resin region in the scribe areas, which are located outside the device region. The width of the openings is 5 µm or more. A process control (e.g., precise adjustment of etching time) is required for the formation of the openings on the ridge structures. The area of each of the openings of the non-photosensitive BCB resin formed on the ridge structures is significantly different from the area of each of the openings of the non-photosensitive BCB resin formed for the scribe areas. Therefore, there is a large difference between the etching rates of the non-photosensitive BCB resin on the ridge structure and in the scribe area. To solve the problem, the process of forming an opening in the non-photosensitive BCB resin region in the scribe area is performed separately from the process of forming an opening in the non-photosensitive BCB resin region on the ridge structure. To satisfactorily form a semiconductor laser bar by cleavage, the thickness of the cured non-photosensitive BCB resin region is preferably less than 2.0 µm and more preferably 1.5 µm or less in the semiconductor region outside the trenches and ridge structure. Thus, the non-photosensitive BCB resin region can be cut along the scribe lines. The thickness of the non-photosensitive BCB resin region is preferably 0.5 µm or more. In this case, the non-photosensitive BCB resin region functions as a protective film that suppresses the damage of the ridge structure in the process of mounting a semiconductor optical device on a sub-mount or package.

The method for producing a semiconductor optical device according to the present invention is not limited to the above-described embodiment, and various modifications can be made. For example, in the embodiment above, the non-photosensitive BCB resin is used as a material for the non-photosensitive resin region, but the material is not limited thereto. A non-photosensitive polymer containing silicon (Si) or the like can be used as a material for the non-photosensitive resin region.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for producing a semiconductor optical device, the method comprising the steps of:
    forming a semiconductor region on a substrate, the semiconductor region including a ridge structure;
    forming an insulating film on the semiconductor region;
    forming a non-photosensitive resin region on the insulating film, the non-photosensitive resin region having an opening on an upper surface of the ridge structure, the ridge structure being embedded with the non-photosensitive resin region;
    forming a first mask on the non-photosensitive resin region, the first mask having an opening that defines a scribe area;
    forming the scribe area by etching the non-photosensitive resin region using the first mask until the insulating film is exposed;
    after removing the first mask, forming an insulating layer by etching the insulating film using the non-photosensitive resin region as a mask, the insulating layer having a first opening on the upper surface of the ridge structure and a second opening in the scribe area;
    forming an electrode in the first opening of the insulating layer on the ridge structure and the non-photosensitive resin region to produce a substrate product;
    forming a scribe line on a surface of the semiconductor region in the scribe area of the substrate product; and
    cutting the substrate product along the scribe line to form a semiconductor laser bar,
    wherein the second opening of the insulating layer in the scribe area is located outside a device region for the semiconductor optical device, and
    the electrode is in direct contact with the upper surface of the ridge structure through the first opening of the insulating layer.

2. The method according to claim 1, wherein, in the step of forming the scribe area, the non-photosensitive resin region is etched by reactive ion etching using a mixed gas containing fluorocarbon and oxygen.

3. The method according to claim 1,
    wherein the step of forming the non-photosensitive resin region includes the steps of:
        forming a non-photosensitive resin on the entire surface of the semiconductor region;
        forming a second mask on the non-photosensitive resin, the second mask having an opening above the upper surface of the ridge structure;
        forming the non-photosensitive resin region by etching the non-photosensitive resin using the second mask; and
        removing the second mask.

4. The method according to claim 1, wherein, in the step of forming the non-photosensitive resin region, the thickness of the non-photosensitive resin region is less than 2.0 µm on the ridge structure.

5. The method according to claim 1, wherein the scribe area extends in a direction crossing an extending direction of the ridge structure, and the width of the scribe area is 5 μm or more.

6. The method according to claim 1,
wherein the first mask also has first and second openings that extend in an extending direction of the ridge structure,
the non-photosensitive resin region has first and second stripe-shape openings defined by the first and second openings of the first mask, respectively,
the opening of the non-photosensitive resin region is formed between the first and second stripe-shape openings, and
the method further comprises a step of separating the semiconductor laser bar into individual semiconductor optical devices at positions of the first and second stripe-shape openings.

7. The method according to claim 1,
wherein the step of forming the semiconductor region further includes the steps of;
forming an epitaxial wafer including a plurality of semiconductor layers grown on the substrate; and
forming first and second trenches that define the ridge structure by etching the epitaxial wafer using a trench mask,
the insulating layer covers side surfaces of the ridge structure and surfaces of the first and second trenches,
the first and second trenches are filled with the non-photosensitive resin region,
the non-photosensitive resin region covers the insulating layer located on the side surfaces of the ridge structure,
the first trench is defined by a first protruding portion and the ridge structure,
the second trench is defined by a second protruding portion and the ridge structure,
the semiconductor region includes the first protruding portion, the second protruding portion, and the ridge structure, and
the thickness of the non-photosensitive resin region is 1.5 μm or less on the first and second protruding portions.

8. The method according to claim 1, wherein, in the step of forming the scribe line, the scribe line has a trench shape.

9. The method according to claim 1,
wherein, in the step of forming the semiconductor laser bar, an end face of the semiconductor laser bar formed by cutting the substrate product extends from an edge of a back of the substrate to an edge of an upper surface of the non-photosensitive resin region, and
the end face of the semiconductor laser bar includes cleavage planes formed in the substrate and the semiconductor region and a fracture surface formed in the non-photosensitive resin region.

10. The method according to claim 1, wherein the non-photosensitive resin region is composed of a non-photosensitive bisbenzocyclobutene resin.

11. The method according to claim 1, wherein the non-photosensitive resin region is composed of a non-photosensitive polymer containing silicon.

* * * * *